United States Patent [19]
Lin

[11] Patent Number: 5,939,903
[45] Date of Patent: Aug. 17, 1999

[54] LOW POWER, SINGLE-PHASE LATCH-TYPE CURRENT SENSE AMPLIFIER

[75] Inventor: Jyhfong Lin, Fremont, Calif.

[73] Assignee: Cirrus Logic, Inc., Fremont, Calif.

[21] Appl. No.: 08/878,726

[22] Filed: Jun. 19, 1997

[51] Int. Cl.[6] .................................. G11C 7/06
[52] U.S. Cl. ............................. 327/57; 327/55
[58] Field of Search ...................... 327/52, 54, 55, 327/57, 51

[56] References Cited

U.S. PATENT DOCUMENTS

| | | | |
|---|---|---|---|
| 4,123,799 | 10/1978 | Peterson | 327/55 |
| 4,521,703 | 6/1985 | Dingwall | 327/55 |
| 4,973,864 | 11/1990 | Nogami | 327/55 |
| 5,036,231 | 7/1991 | Kanbara | 327/55 |
| 5,345,121 | 9/1994 | Itoh | 327/55 |
| 5,506,524 | 4/1996 | Lin | 327/57 |
| 5,552,728 | 9/1996 | Lin | 327/57 |

*Primary Examiner*—Toan Tran
*Attorney, Agent, or Firm*—Victor Okumoto; Frank D. Nguyen

[57] ABSTRACT

A sense amplifier circuit is incorporated within a computer system and utilizes a latch coupled to an equalizing transistor that operates in the triode region and initially equalizes the sense amplifier circuit data outputs, the latch subsequently develops a voltage difference in response to a control signal, deactivation of the control signal then turns off the equalizing transistor thereby allowing the latch circuit to lock the developed voltage differential to full-swing across the sense amplifier data outputs.

8 Claims, 3 Drawing Sheets

5,939,903

LOW POWER, SINGLE-PHASE LATCH-TYPE CURRENT SENSE AMPLIFIER

FIELD OF THE INVENTION

This invention relates in general to sense amplifiers and in particular, to current sense amplifiers generating latched complementary logic level data outputs.

DESCRIPTION OF THE RELATED ART

Sense amplifier circuits have been designed for and used in a number of circuit applications. For example, they are used in memory reading circuitry for reading the programmed states of memory cells by sensing voltage or current differences between bit line pairs connected to individual memory cells. As another example, they are used in comparator circuitry for comparing a voltage or current on a data line to another voltage or current by sensing the difference between two voltages or currents.

Current sense amplifier circuits are capable of delivering better performance than voltage sense amplifier circuits because the differential currents that they sense lead their voltage counterparts by 90 degrees in phase. Accordingly, since the signals that they sense develop faster than those being sensed by voltage sense amplifier circuits, current sense amplifier circuits provide faster indications of data line differences than their voltage counterparts.

In the prior art, sense amplifiers have been described that include three stages to generate latched complementary logic level data outputs. During a voltage equalization stage, the data output terminals of a sense amplifier are reset by equalizing the voltages at the output terminals to a predetermined value. Next, during a voltage development stage, an initial voltage differential is developed across the data output terminals which indicates a difference in potential between the data input terminals of the sense amplifier. Finally, during a full-swing locking stage, the developed voltage differential at the output terminals is pulled to "full-swing", thereby generating the latched complementary logic level data outputs.

Conventionally, sense amplifiers require several control signals in order to generate the latched complementary logic level data outputs. However, increasingly, there is a need for high performance and reliable sense amplifiers which operate at lower power levels, are smaller in size, are less costly, and utilize fewer control signals.

SUMMARY OF THE INVENTION

In accordance with the present invention, a sense amplifier for generating latched complementary logic level outputs in response to a single control signal is provided.

The sense amplifier circuit comprises a latch circuit (e.g., 112), a first input transistor (e.g., 106), a second input transistor (e.g., 108), and a third transistor (e.g., 132). The latch circuit includes latch transistors (e.g., 114, 116, 118 and 120). The first and second input transistors respectively provide first and second input currents (e.g., $I_{in1}$ and $I_{in2}$) to the latch circuit. The third transistor is coupled to the latch circuit and to a control signal (e.g., $\Phi_0$). The third transistor is sized relative to the latch transistors and the first and second input transistors, and a magnitude of the control signal is selected such that when the control signal is activated the third transistor initially tends to equalize voltages on first and second data outputs (e.g., dout1 and dout2) and then allows a voltage differential to develop across the first and second data outputs indicative of a difference between the first and the second input currents. When the control signal is deactivated the third transistor turns off so as to allow the latch circuit to swing the voltage differential to a full-scale value (e.g., Vdd-GND).

DETAILED DESCRIPTION OF THE PREFERRED EMBODIMENT

Figure 1:
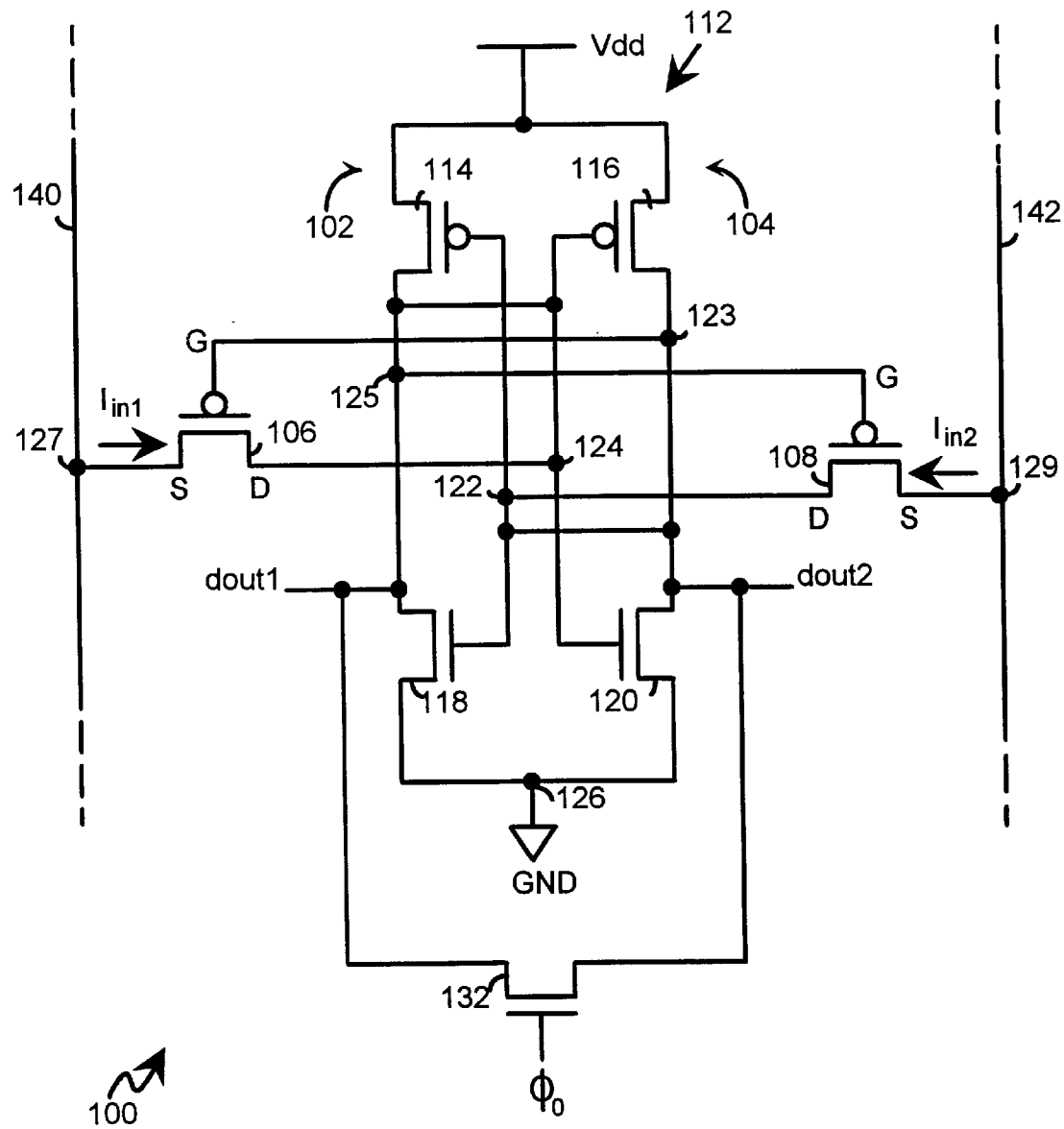
FIG. 1 illustrates a latch-type current sense amplifier circuit utilizing aspects of the present invention.

FIG. 1 illustrates a latch-type current sense amplifier circuit 100 in accordance with the present invention. Preferably, current sense amplifier 100 is used when first and second data lines, 140 and 142, are precharged to a high voltage level such as Vdd before sensing. Sense amplifier circuit 100 receives first and second current inputs, $I_{in1}$ and $I_{in2}$, respectively via first and second data lines, 140 and 142. First and second data lines 140 and 142 are typically generated from an analog circuit (e.g., 308 in FIG. 3) such as a memory cell. 100 also receives control signal $\Phi_0$ at the gate of NMOS transistor 132. In response to control signal $\Phi_0$, sense amplifier circuit 100 provides first and second latched data outputs, dout1 and dout2, respectively via first and second output data lines (e.g., data bus 302 in FIG. 3). The data output of sense amplifier circuit 100 has logic states determined by a difference between the first and second current inputs, $I_{in1}$ and $I_{in2}$ and voltage levels determined by high and low reference voltages, Vdd and GND. First and second outputs, dout1 and dout2, are typically provided to a digital circuit such as a processor (e.g., 306 in FIG. 3).

The heart of current sense amplifier circuit 100 is latch circuit 112 which includes first and second inverters, 102 and 104, respectively. First inverter 102 includes PMOS transistor 114 and NMOS transistor 118, wherein a source of PMOS transistor 114 acts as a high voltage reference input of first inverter 102, a source of the NMOS transistor 118 acts as a low reference voltage input of first inverter 102, drains of the PMOS transistor 114 and the NMOS transistor 118 are connected together to form an output 125 of first inverter 102, and gates of the PMOS transistor 114 and the NMOS transistor 118 are connected together to form an input 122 of first inverter 102. In a similar fashion, second inverter 104 includes PMOS transistor 116 and NMOS transistor 120, wherein a source of PMOS transistor 116 acts as a high voltage reference input of second inverter 104, a source of NMOS transistor 120 acts as a low voltage reference input of second inverter 104, drains of PMOS transistor 116 and NMOS transistor 120 are connected together to form an output 123 of second inverter 104, and gates of PMOS transistor 116 and NMOS transistor 120 are connected together to form an input 124 of second inverter 104.

First and second inverters, 102 and 104, are termed "cross-coupled" inverters, because the input 122 of first inverter 102 is connected to the output 123 of second inverter 104, and the input 124 of second inverter 104 is connected to the output 125 of first inverter 102. Latch circuit 112, which consists of cross-coupled inverters, 102 and 104, also includes first and second inputs, 124 and 122, and first and second outputs, 125 and 123. For clarification purposes, first input 124 of latch circuit 112 is the same as input 124 of second inverter 104, second input 122 of latch circuit 112 is the same as input 122 of first inverter 102. Additionally, first output 125 of latch circuit 112 is the same as the output of first inverter 102 and provides first data output dout1. Second output 123 of latch circuit 112 is the same as the output of second inverter 104 and provides second data output dout2. First and second outputs, 125 and 123, of latch circuit 112 are termed a "complementary pair" because when first output 125 (dout1) stabilizes at a HIGH logic state determined by a high reference voltage such as Vdd applied to the high reference inputs of first and second inverters, 102 and 104, second output 123 (dout2) stabilizes at a LOW logic state determined by a low reference voltage such as GND applied to the low reference inputs of first and second inverters, 102 and 104. Conversely, when first output 125 (dout1) stabilizes at a LOW logic state determined by the low reference voltage applied to the low reference inputs of first and second inverters, 102 and 104, second output 123 (dout2) stabilizes at a HIGH logic state determined by the high reference voltage applied to the high reference inputs of first and second inverters, 102 and 104.

First and second outputs, 125 and 123, of latch circuit 112 are respectively coupled to first and second data outputs, dout1 and dout2, of sense amplifier circuit 100, such that voltages on corresponding latch and sense amplifier circuit outputs are substantially the same. Accordingly, first output 125 of latch circuit 112 and first output dout1 of sense amplifier 100 are referred to herein interchangably. Similarly, second output 123 of latch circuit 112 and second output dout2 of sense amplifier 100 are also referred to herein interchangably. For symmetrical operation, PMOS latch transistors 114 and 116 form a matched pair, NMOS latch transistors 118 and 120 form a matched pair, and PMOS input transistors 106 and 108 form a matched pair.

PMOS input transistors 106 and 108 provide first and second current inputs, $I_{in1}$ and $I_{in2}$, respectively to first and second inputs, 124 and 122, of latch circuit 112. PMOS input transistor 106 has a source connected at node 127 to first data line 140 for receiving first current input $I_{in1}$, a drain connected to first input 124 of latch circuit 112 for providing first current input $I_{in1}$ to first input 124 of latch circuit 112, and a gate connected to second output 123 of latch circuit 112 for automatically adjusting the current $I_{in1}$ passing through PMOS input transistor 106. Similarly, PMOS input transistor 108 has a source connected at node 129 to second data line 142 for receiving second current input $I_{in2}$, a drain connected to second input 122 of latch circuit 112 for providing second current input $I_{in2}$ to second input 122 of latch circuit 112, and a gate connected to first output 125 of latch circuit 112 for automatically adjusting the current $I_{in2}$ passing through PMOS input transistor 108.

PMOS input transistors, 106 and 108, act as self-regulating inputs for latch-type current sense amplifier circuit 100. When data outputs, dout1 and dout2, are equalized, they are in saturated conducting states to reduce input impedances of latch-type current sense amplifier circuit 100. Therefore, more input data line currents are allowed to flow into latch-type current sense amplifier circuit 100. As a consequence, latch-type current sense amplifier circuit 100 can more quickly sense current differences between first and second input currents, $I_{in1}$ and $I_{in2}$ in developing a voltage differential across data outputs, dout1 and dout2. Subsequently, after adequately charging up input nodes, 124 and 122, of latch circuit 112, they automatically change their conductive states to speed up the latching of the data outputs, dout1 and dout2. In particular, because of the feedback connections from outputs, 123 and 125, of latch circuit 112 to respective gates of PMOS input transistors, 106 and 108, PMOS input transistor, 106 or 108, whichever is receiving the smaller of the two input currents, $I_{in1}$ and $I_{in2}$, to sense amplifier circuit 100 is forced to turn off. Accordingly, the latching of the data outputs, dout1 and dout2, is sped up by eliminating the contention situation in latch circuit 112, as well as eliminating power consumption resulting from current entering latch circuit 112 through that PMOS input transistor. Meanwhile, as the high data output, dout1 or dout2, swings to the high reference voltage Vdd, the other of the PMOS input transistors, 108 or 106, is forced to operate in its linear or triode region. By properly sizing PMOS input transistors, 106 and 108, to have high output conductances, power consumption resulting from current entering the latch circuit 112 through this PMOS input transistor may also be minimized. This is so because the currents, $I_{in1}$ and $I_{in2}$, entering latch circuit 112 through PMOS input transistors, 108 or 106, are minimal or zero after full-swing latching.

NMOS equalizing transistor 132 is coupled across the data outputs, dout1 and dout2, by having a source/drain coupled to data output dout1 (node 125), a drain/source coupled to data output dout2 (node 123), and a gate coupled to control signal $\Phi_0$. The magnitude of control signal $\Phi_0$ is selected such that when control signal $\Phi_0$ is activated, NMOS equalizing transistor 132 operates in its triode region so as to resemble a pure resistance. By properly sizing NMOS equalizing transistor 132 with respect to the other transistors in sense amplifier circuit 100, NMOS equalizing transistor 132 responds to the activation of control signal $\Phi_0$ (i.e., the control signal $\Phi_0$ going logic level HIGH). More specifically, in response to the activation of control signal $\Phi_0$, NMOS equalizing transistor 132 initially at least tends to equalize the voltages on the data outputs, dout1 and dout2, then allows latch circuit 112 to develop a voltage differential across the data outputs, dout1 and dout2. The voltage differential across the data outputs, dout1 and dout2, is indicative of the difference between the first and second current inputs, $I_{in1}$ and $I_{in2}$. NMOS equalizing transistor 132 subsequently responds to the deactivation of control signal $\Phi_0$ (i.e., the control signal $\Phi_0$ going logic level LOW), by turning itself off, thereby allowing latch circuit 112 to swing the developed voltage differential to full-scale (i.e., the voltage on one of the data outputs pulled up to Vdd and the voltage on the other of the data outputs pulled down to GND), and latch (or lock) the generated complementary logic level voltages on the data outputs, dout1 and dout2.

Proper sizing of NMOS equalizing transistor 132 can be determined in practice by conventional circuit simulation techniques. A small-signal linear analysis of sense amplifier circuit 100, however, results in the following desired relationship (which can be used as guidance) between the transconductances of the NMOS and PMOS transistors of latch circuit 112, and the output conductance of NMOS equalizing transistor 132:

$$(1/g_{ds3}) < abs(2/g_{m1}) \| abs(2/g_{m2}) \qquad (1)$$

wherein parallel bars indicate parallel components, "abs" indicates absolute value, and $g_{ds3}$=output conductance of NMOS equalizing transistor 132;

$g_{m1}$=tranconductance of NMOS transistors, 118 and 120, of latch 112; and $g_{m2}$=transconductance of PMOS transistors, 114 and 116, of latch 112.

Similarly, the small-signal gain of sense amplifier circuit 100 is approximately determined to provides additional guidance by a second desired relationship (which is to be maximized) between the transistors of the sense amplifier circuit 100:

$$\text{gain}=(g_{m4}/2)*[(1/g_{ds3})\|(-2/g_{m1})\|(-2/g_{m2})] \qquad (2)$$

wherein parallel bars indicate parallel components, terms $g_{ds}$, $g_{m1}$ and $g_{m2}$ are defined above, and $g_{m4}$=tranconductance of PMOS input transistors, 106 and 108, of sense amplifier circuit 100.

Initial sizing of NMOS equalizing transistor 132 can be determined by first sizing the input and latch transistors, then selecting a size for NMOS equalizing transistor 132 resulting in an output conductance $g_{ds3}$ which maximizes the gain of equation (2) while maintaining the conductance relationship of equation (1). Alternatively, or as a refinement to such initial sizing technique, conventional computer simulation techniques may be employed to properly size NMOS equalizing transistor 132, and if necessary, resize the input and/or latch transistors of sense amplifier circuit 100.

For NMOS equalizing transistor 132 to be properly sized, it is a necessary that the voltage differential developed across the data outputs, dout1 and dout2, be indicative of the difference between the input currents, $I_{in1}$ and $I_{in2}$, before control signal $\Phi_0$ is deactivated. Otherwise, when control signal $\Phi_0$ is deactivated and NMOS equalizing transistor 132 turns off, latch circuit 112 will lock the wrong voltages to full-swing, thereby providing an erroneous reading on the data outputs, dout1 and dout2.

Figure 2:
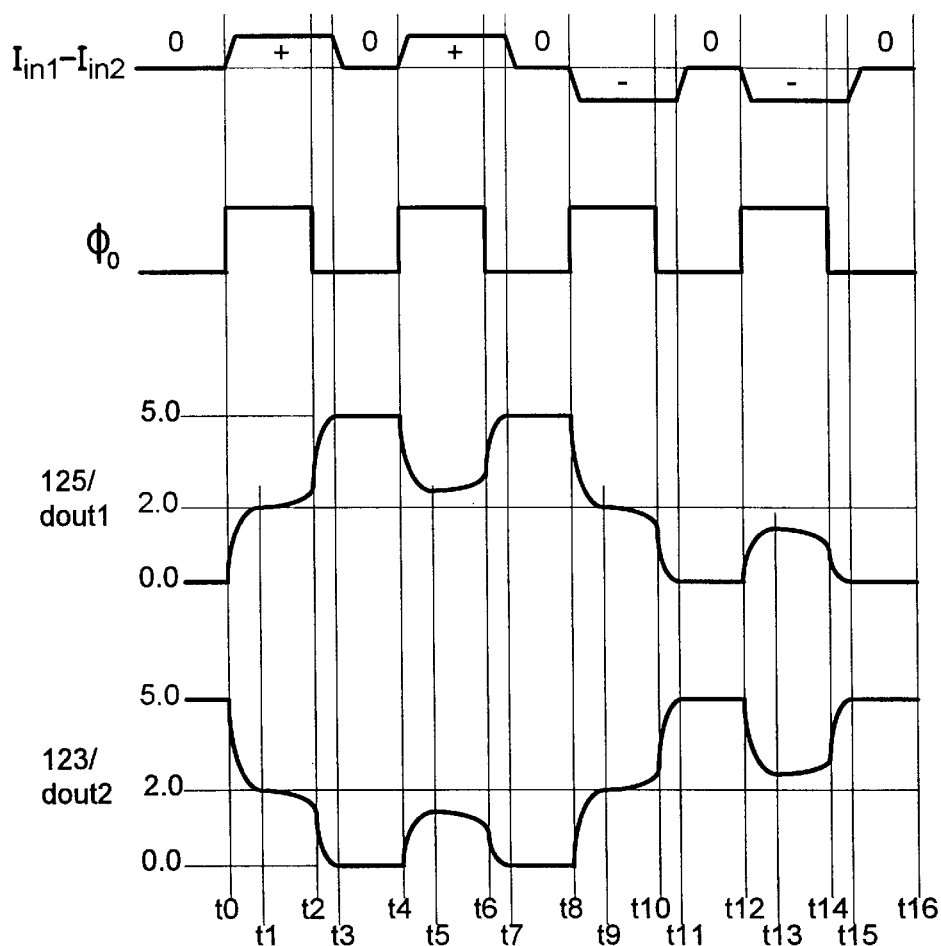
FIGS. 2a–2d illustrate timing diagrams for an input current difference, a control signal, and resulting outputs of the sense amplifier circuit of FIG. 1, utilizing aspects of the present invention.

FIGS. 2a–2d illustrate timing diagrams useful for further describing the operation of sense amplifier circuit 100. In particular, FIG. 2a illustrates differences between the input currents, $I_{in1}$ and $I_{in2}$, provided in different read (or sense) cycles to the input transistors, 106 and 108, of sense amplifier circuit 100; FIG. 2b illustrates a control signal $\Phi_0$ provided to NMOS equalizing transistor 132 of sense amplifier circuit 100; and FIGS. 2c and 2d illustrate timing diagrams for complementary data outputs, dout1 and dout2, of sense amplifier circuit 100, resulting from the current difference and control signal depicted in FIGS. 2a–2b.

Referring to FIG. 2a, sense amplifier 100 performs four read cycles respectively at times t0, t4, t8 and t12. For each read cycle, a select circuit (not shown) couples the first and second data lines, 140 and 142, to different analog elements, such as memory cells, resulting in the current differences shown. In a prior reading corresponding to the time period prior to time t0, it is assumed for the purposes of the example that the first data output dout1 has been latched to a LOW logic level (e.g., GND or 0 volts), and the second data output dout2 has been latched to a HIGH logic level (e.g., Vdd or 5.0 volts). In the first read cycle initiated at time t0, the currents flowing through the data lines 140 and 142 reverse, wherein it is assumed for the example that the current flowing through the data line 140 to be greater than the current flowing through the data line 142, and as a consequence, the difference ($I_{in1}-I_{in2}$) between the input currents, $I_{in1}$ and $I_{in2}$, becomes positive. In the second read cycle initiated at time t4, the relative currents flowing through the data lines 140 and 142 are the same as the previous read cycle, and as a consequence, the difference ($I_{in1}-I_{in2}$) between the input currents, $I_{in1}$ and $I_{in2}$, is again positive. In the third read cycle initiated at time t8, however, the currents flowing through the data lines 140 and 142 reverse, and as a consequence, the difference ($I_{in1}-I_{in2}$) between the input currents, $I_{in1}$ and $I_{in2}$, is negative. In the fourth read cycle initiated at time t12, the currents flowing through the data lines 140 and 142 remain the same as the previous read cycle, and as a consequence, the difference ($I_{in1}-I_{in2}$) between the input currents, $I_{in1}$ and $I_{in2}$, is again negative.

Referring to FIG. 2b, control signal $\Phi_0$ appears as a train of positive pulses. Since control signal $\Phi_0$ is generally generated from a system clock signal, its width (e.g., period between t0 and t2) is generally a fraction or multiple of the period of the system clock signal. In the preferred embodiment, the width is a fraction, such as one-half, of the period of the system clock signal to maximize performance. Although the pulses of control signal $\Phi_0$ appear as a 50% duty cycle square wave in the figure, this is only done for convenience, and it is to be appreciated that in practice, the pulses may occur at any time when sense amplifier circuit 100 is to sense (or read) a current difference between data lines 140 and 142.

Referring now to FIGS. 2c and 2d, prior to time t0, it is assumed for the purposes of example that the first data output dout1 has been latched to a LOW logic level and the second data output dout2 has been latched to a HIGH logic level. At time t0, however, the relationship of the currents is such that the input current $I_{in1}$ from the data line 140 is greater than the input current $I_{in2}$ from the data line 142. As a consequence, the first data output dout1 is to transition from the LOW logic level to the HIGH logic level and the second data output dout2 is to conversely transition from the HIGH logic level to the LOW logic level. Because the complementary data outputs, dout1 and dout2, must transition between logic levels, it is necessary that NMOS equalizing transistor 132 completely equalizes voltages on the two data outputs at some time (e.g., at time t1) prior to its being turned off to allow latch circuit 112 to adequately develop a voltage differential across the data outputs, dout1 and dout2, which is indicative of the difference in input currents, $I_{in1}$ and $I_{in2}$. In other words, the voltage on input node 124 should be greater than that on input node 122 so that after being latched to full-swing, the second data output dout2 will be pulled down to the LOW logic level and the first data output dout1 will be pulled up to the HIGH logic level. Otherwise, erroneous readings will be latched onto the data outputs, dout1 and dout2, when the control signal $\Phi_0$ is deactivated. At time t3, latch circuit 112 has effectively latched the data outputs, dout1 and dout2, to full-swing, and the input current difference ($I_{in1}-I_{in2}$) drops to almost zero (near the end of time t3) since PMOS input transistor 108 turns off and PMOS input transistor 106 enters its high impedance triode region, as previously described.

At time t4, another read cycle is initiated. In this read cycle, the relationship between the input currents, $I_{in1}$ and $I_{in2}$, does not change from the previous read cycle. Accordingly, although NMOS equalizing transistor 132, operating in its triode region due to activation of the control signal $\Phi_0$, tends to equalize the data outputs, dout1 and dout2, it is preferable that it does not completely do so. In so doing, erroneous readings are not latched onto the data outputs, dout1 and dout2, by sense amplifier circuit 100. Subsequent read cycles initiated at times t8 and t12 exhibit similar, but flipped, characteristics as the read cycles initiated at times t0 and t4. In particular, since a logic level transition on the latched complementary data outputs, dout1 and dout2, will occur following the read cycle initiated at time t8, it is necessary that NMOS equalizing transistor 132 completely equalize the voltages on the data outputs, dout1 and dout2, prior to initiating its full-swing locking stage. Conversely, since a logic level transition will not occur following the read cycle initiated at time t12, it is preferable that the NMOS equalizing transistor 132 does not equalize the voltages on the data outputs, dout1 and dout2, prior to initiating its full-swing locking stage.

Figure 3:
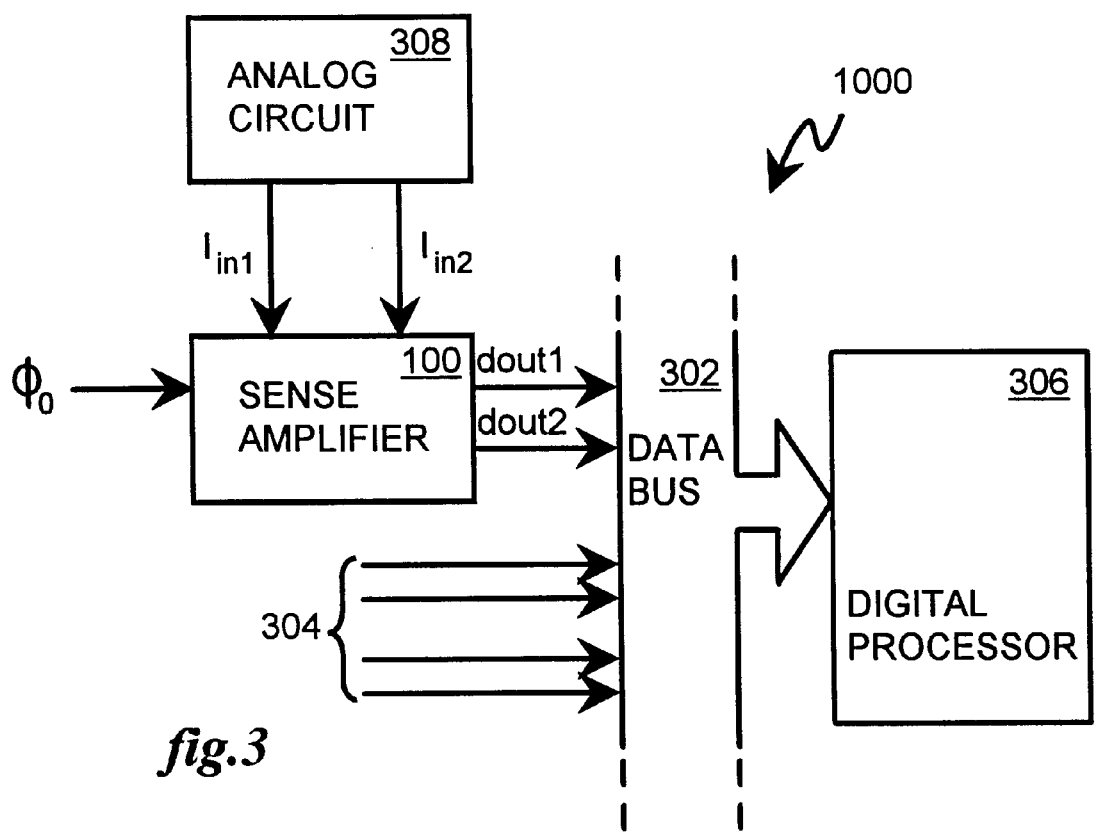
FIG. 3 illustrates a block diagram of a processor system including the sense amplifier circuit of FIG. 1, utilizing aspects of the present invention.

FIG. 3 illustrates, as an example, a computer system 1000 including latch-type current sense amplifier circuit 100, analog circuit 308, a digital processor 306, and data bus 302. Latch-type current sense amplifier circuit 100 receives first and second input currents, $I_{in1}$ and $I_{in2}$, from analog circuit 308, and a control signal $\Phi_0$ from a control signal generator unit (not shown). Latch-type current sense amplifier circuit 100 then generates in response of such received inputs, first and second latched data outputs, dout1 and dout2, in a manner as described in reference to FIGS. 1–2, and provides such first and second latched data outputs, dout1 and dout2, to the digital processor 306 via the data bus 302.

As an example, the first and second input currents, $I_{in1}$ and $I_{in2}$, may be provided by respective first and second bit lines of a bit line pair connected to a memory cell. In this case, latch-type current sense amplifier circuit 100 preferably provides its latched logic level data outputs, dout1 and dout2, to respective tri-state drivers (not shown) of data bus 302. The tri-state drivers of data bus 302 in turn provide their outputs to digital processor 306 when enabled by digital processor 306. Digital processor 306, which may be any one of numerous commercially available microprocessors, such as the type manufactured by Intel Corporation and Motorola Inc., then processes the latched data outputs, dout1 and dout2, received from the latch-type current sense amplifier circuit 100, along with other data outputs 304 received, for example, from one or more other circuits (not shown) in computer system 1000.

As another example, the first and second input currents, $I_{in1}$ and $I_{in2}$, may be provided by respective first and second analog data lines, wherein the first analog data line is connected to a reference current and the second analog data line is connected to a current which is to be compared against the reference current. In this case, latch-type current sense amplifier circuit 100 functioning as a comparator, may again provide its latched logic level data outputs, dout1 and dout2, to respective tri-state drivers (not shown) of the data bus 302, which in turn, provide their outputs to the digital processor 306 when enabled by the digital processor 306. The digital signal processor 806 then processes the latched data outputs, dout1 and dout2, received from the latch-type current sense amplifier circuit 100, along with other data outputs 304 received, for example, from one or more other circuits (not shown) in the computer system 1000.

What is claimed is:

1. A sense amplifier circuit for generating full-swing latched complementary first and second data outputs indicative of an input difference between first and second data inputs, comprising:

a latch circuit including first and second PMOS transistors individually having a source, drain, and control gate, and first and second NMOS transistors individually having a source, drain, and control gate, wherein said first PMOS and said first NMOS transistors are coupled together to form a first inverter, and said second PMOS and said second NMOS transistors are coupled together to form a second inverter, and said first and said second inverters are cross-coupled to form said latch circuit;

a first input transistor having a source, drain, and control gate, said first input transistor source coupled to said first data input, said first input transistor drain coupled to an output of said latch circuit first inverter, and said first input transistor control gate coupled to an input of said latch circuit first inverter;

a second input transistor having a source, drain, and control gate, said second input transistor source coupled to said second data input, said second input transistor drain coupled to an output of said latch circuit second inverter, and said second input transistor control gate coupled to an input of said latch circuit second inverter; and an equalization transistor having a source and drain respectively coupled to said first and said second data outputs, and a gate coupled to a control signal, wherein said equalization transistor is biased in its triode region so that its impedance resembles a resistor, and a magnitude of said control signal is selected such that when said control signal is activated said equalization transistor initially tends to equalize voltages on said first and said second data outputs and then allows a voltage differential to develop across said first and said second data outputs indicative of a difference between said first and said second data inputs, and when said control signal is deactivated said equalization transistor turns off so as to allow said latch circuit to swing said voltage differential to a full-scale value.

2. The sense amplifier circuit as recited in claim 1, said matched first and second NMOS transistors each having a transconductance gm1, said matched first and second PMOS transistors each having a transconductance gm2, said equalization transistor having an output conductance gds3, and said first and second input transistors each having a transconductance gm4, wherein said transconductances gm1, gm2, and gm4 and said output conductance gds3 satisfy the following constraints:

(a) (1/gds3)<absolute value of (2/gm1) in parallel with absolute value of (2/gm2), and (b) the small signal gain of the sense amplifier circuit is maximized.

3. The sense amplifier circuit as recited in claim 2, wherein the small signal gain of the sense amplifier circuit is approximately equal to (gm4/2) multiplied with {(1/gds3) in parallel with (−2/gm1) in parallel with (−2/gm2)}.

4. A computer system comprising:

a microprocessor;

a data bus coupled to said microprocessor; and a sense amplifier circuit coupled to said data bus, wherein said sense amplifier circuit for generating full-swing latched complementary first and second data outputs indicative of an input difference between first and second data inputs, including a latch circuit including first and second PMOS transistors individually having a source, drain, and control gate, and first and second NMOS transistors individually having a source, drain, and control gate, wherein said first PMOS and said first NMOS transistors are coupled together to form a first inverter, and said second PMOS and said second NMOS transistors are coupled together to form a second inverter, and said first and said second inverters are cross-coupled to form said latch circuit, a first input transistor having a source, drain, and control gate, said first input transistor source coupled to said first data input, said first input transistor drain coupled to an output of said latch circuit first inverter, and said first input transistor control gate coupled to an input of said latch circuit first inverter, a second input transistor having a source, drain, and control gate, said second input transistor source coupled to said second data input, said second input transistor drain coupled to an output of said latch circuit second inverter, and said second input transistor control gate coupled to an input of said latch circuit second inverter, and an equalization transistor having a source and drain respectively coupled to said first and said second data outputs, and a gate coupled to a control signal, wherein said equalization transistor is biased in its triode region so that its impedance resembles a resistor, and a magnitude of said control signal is selected such that when said control signal is activated said equalization transistor initially tends to equalize voltages on said first and said second data outputs and then allows a voltage differential to develop across said first and said second data outputs indicative of a difference between said first and said second data inputs, and when said control signal is deactivated said equalization transistor turns off so as to allow said latch circuit to swing said voltage differential to a full-scale value.

5. The computer system as recited in claim 4, said matched first and second NMOS transistors of said sense amplifier circuit each having a transconductance gm1, said matched first and second PMOS transistors of said sense amplifier circuit each having a transconductance gm2, said equalization transistor of said sense amplifier circuit having an output conductance gds3, and said first and second input transistors of said sense amplifier circuit each having a transconductance gm4, wherein said transconductances gm1, gm2, and gm4 and said output conductance gds3, satisfy the following constraints:

(a) (1/gds3)<absolute value of (2/gm1) in parallel with absolute value of (2/gm2), and (b) the small signal gain of the sense amplifier circuit is maximized.

6. The computer system as recited in claim 5, wherein the small signal gain of the sense amplifier circuit is approximately equal to (gm4/2) multiplied with {(1/gds3) in parallel with (−2/gm1) in parallel with (−2/gm2)}.

7. A current sense amplifier circuit comprising:

a latch circuit including latch transistors, said latch circuit having first and second data outputs;

first and second input transistors respectively providing first and second input currents to said latch circuit; and a third transistor coupled to said latch circuit and to a control signal, wherein said third transistor is sized relative to said latch transistors and said first and said second input transistors, and a magnitude of said control signal is selected such that when said control signal is activated said third transistor initially tends to equalize voltages on said first and second data outputs and then allows a voltage differential to develop across said first and said second data outputs indicative of a difference between said first and said second input currents, and when said control signal is deactivated said third transistor turns off so as to allow said latch circuit to swing said voltage differential to a full-scale value.

8. The current sense amplifier circuit as recited in claim 7, wherein said first and said second input transistors are coupled to said latch circuit such that said first and said second input transistors are in saturated conducting states when said first and second data outputs are equalized, and one of said first and said second input transistors receiving a smaller of said first and said second input currents is forced to turn off while the other of said first and said second input transistors is forced to operate in a triode region when said third transistor turns off and said latch circuit swings said voltage differential to said full-scale value.

* * * * *